United States Patent [19]

Köhler

[11] 3,977,904

[45] Aug. 31, 1976

[54] SEMI-CONDUCTOR BATTERY

[75] Inventor: Franz Köhler, Unterhaching, Germany

[73] Assignee: Messerschmitt-Bolkow-Blohm GmbH, Munich, Germany

[22] Filed: Mar. 17, 1975

[21] Appl. No.: 558,859

[30] Foreign Application Priority Data

Mar. 29, 1974 Germany............................ 2415187

[52] U.S. Cl.................................. 136/89; 29/572; 136/206; 427/75; 427/248
[51] Int. Cl.$^2$......................................... H01L 31/04
[58] Field of Search................................... 136/89

[56] References Cited
UNITED STATES PATENTS

| | | | |
|---|---|---|---|
| 2,915,578 | 12/1959 | Pensak.................................. | 136/89 |
| 3,483,038 | 12/1969 | Hui et al.............................. | 136/89 |
| 3,713,893 | 1/1973 | Shirland............................... | 136/89 |

FOREIGN PATENTS OR APPLICATIONS

| | | | |
|---|---|---|---|
| 1,414,655 | 9/1965 | France................................. | 136/89 |
| 1,564,935 | 6/1970 | Germany.............................. | 136/89 |
| 867,276 | 5/1961 | United Kingdom.................. | 136/89 |

OTHER PUBLICATIONS

D. Abbott, "Lightweight Large Area Solar Arrays," Conference Proceedings of Interscience Energy Conversion Conference, Wash., D. C., 1969.

*Primary Examiner*—John H. Mack
*Assistant Examiner*—Aaron Weisstuch
*Attorney, Agent, or Firm*—McGlew and Tuttle

[57] ABSTRACT

The battery is of the type including a plurality of laminar semi-conductor bodies arranged on a dielectric support in parallel relation to each other and each comprising respectively layers of two different but oppositely conducting semi-conductor material forming a photovoltaic junction, with the layer adjacent the support being of the same conducting type in all of the semi-conductor bodies, and including contact strips electrically interconnecting oppositely conducting layers of adjacent semi-conductor bodies and extending throughout the length thereof. The support has one surface thereof formed with a plurality of V-shape notches extending parallel to each other and separated by lands, and the semi-conductor bodies are applied directly to the lands. The contact strips extend in the notches between two adjacent lands and are, along the edge of one land, in electrical contact with the inner layer of the respective semi-conductor body on the one land and which is directly adjacent the support. Along the other edge, each contact strip is in electrical contact with the outer layer of the respective semi-conductor body on the other land and which is remote from the support. The support is preferably flexible and the opposite surface of the support is divided into individual, juxtaposed cylindrical segments with each land being associated with a single respective segment. The outer layer of each semi-conductor body is covered with a layer of contact material electrically connected to that contact strip which is electrically connected to the outer layer, and the notched surface is covered with an electrically insulating protective layer which preferably is elastic.

10 Claims, 11 Drawing Figures

SEMI-CONDUCTOR BATTERY

FIELD AND BACKGROUND OF THE INVENTION

This invention relates to a semi-conductor battery of the type including a plurality of laminar semi-conductor bodies arranged on a dielectric support in parallel relation to each other and each comprising two layers of respectively oppositely conducting semi-conductor materials with the layer adjacent the support being of the same conducting type in all of the semi-conductor bodies, and including contact strips electrically interconnecting complementarily conducting layers of adjacent semi-conductor bodies and extending throughout the length of the bodies, and to a method of manufacturing such a semi-conductor body.

A semi-conductor battery of this kind, for converting light into electric energy, is described in the German disclosure document (Offenlegungsschrift) No. 1,564,935. In this disclosure, the semi-conductor bodies are applied to the surface of a support and, preferably, are formed by vapor deposition of contact material and semi-conductor materials, the areas of the support not to be coated being covered, during deposition, by metal masks. The support used for this purpose may be glass, plastics, or ceramic material, for example.

To protect the individual semi-conductor bodies of the known semi-conductor battery from disintegration by weathering, on the earth, or from radiation, in space, the semi-conductor bodies applied to the supporting surface must be shielded, either by cover glasses provided for each of the semi-conductor bodies of by providing a transparent layer covering the entire semi-conductor battery. The cited disclosure, however, does not contain any indication of how this should be done.

Further, in the known semi-conductor battery, stresses are caused within the support by buckling and bending forces, in a large region around their point of attack, which stresses also affect the individual semi-conductor bodies and electric connections. This may lead to a loosening of the deposited contact strips or semi-conductor bodies from the support. Particularly sensitive areas in this respect are the contact edges between the semi-conductor bodies and the contact strips. Due to the buckling and bending forces, the electric connections along these edges may be broken whereby the operation of the entire semi-conductor battery is jeopardized.

In spite of the simpler manufacture of the mentioned known semi-conductor battery relative to other batteries assembled of individual small semi-conductor bodies, at least three masks are still needed for the manufacture in this case. Presence of dirt, positioning difficulties, and tolerance deviations are problems in this technology which, as far as large-surface semi-conductor batteries are concerned, can be overcome only by a highly accurate and expensive manufacture which is hardly suitable for a series production.

SUMMARY OF THE INVENTION

The present invention is directed to such a design of the support, as well as to the application of the semi-conductor bodies and contact strips to the support, which would result in an improvement of the mechanical and electric properties of the semi-conductor battery as compared to the prior art, in protection of the semi-conductor bodies against atmospheric influences and radiation, and, finally, in a simplification or even complete abandonment of the masking technique in the manufacture of semi-conductor batteries.

In accordance with the invention, these objectives are attained by forming one surface of the support with a plurality of notches extending parallel to each other and separated by lands, with the semi-conductor bodies being applied directly to the lands and the contact strips extending in the notches between two adjacent lands and being, along the edge of one of these two adjacent lands, in electrical contact with the inner layer of the respective conductor body on the one land and which is directly adjacent the support, and, along the other edge of the respective two lands, being in electrical contact with the outer layer of the respective semi-conductor body on the other land, and which is remote from the support.

Due to the notches with the contact strips extending therein, the support, which may also be made of a flexible material, ensures that bending or buckling forces are absorbed primarily in the zone of the notches and are not transmitted to the lands supporting the semi-conductor bodies or the edges thereof along which the individual semi-conductor bodies are in electrical contact.

A triangular cross-section of the notches is particularly advantageous because, in such a case, stresses occur in the support approximately only in the zone of the apices of the notches, and the greatest part of the contact strips and semi-conductor bodies is located in the zones which are free of stress. In itself, no limits are set to the extension of the individual strips and notches as to their width and length. However, if the support is a foil, the lands are advantageously only some millimeters wide. Thereby, the handling of the semi-conductor battery, for example, during packaging or shipping, and also if used for the supply of a satellite with current, is simplified by such a design because the semi-conductor battery can be wound up without causing a stress in the individual semi-conductor bodies or contact strips and, thereby, a detaching from the support.

To protect the entire semi-conductor battery effectively from damages, the underside of the support as a whole is provided with an electrically insulating and, preferably, elastic protective coating, for example, of plastics.

When using a semi-conductor battery as a solar battery, care is taken to convert into electric energy a maximum possible part of the incident light. In the above mentioned known semi-conductor battery described in the cited German disclosure No. 1,564,935, the light falling on the contact strips is lost for conversion into electric energy, so that only 80 to 90 percent of the total incident light can be utilized for generating electric energy in the semi-conductor battery.

In a semi-conductor battery in accordance with the invention, this percentage can be improved solely by the shape of the cross-section of the notches provided on the underside of the support. Since the material of the contact strips applied to the walls of the notches acts as a mirror for the incident light, the notches are shaped, preferably, so that at least a part of the incident light is reflected onto the semi-conductor bodies.

However, the light yield can be increased considerably, in addition, by subdividing the opposite or upper surface of the support into individual cylindrical segments or reeds adjacent each other so that a single respective reed is associated with each land supporting a semi-conductor body and the light falling perpendicularly on this reed is directed to the associated semi-conductor body. In this manner, the light yield can be increased up to nearly 100 percent.

In a method of manufacturing the just described semi-conductor battery, on that surface of the support, such as the undersurface, which is formed with the notches extending parallel to each other and having lands remaining between the individual notches, the lands are covered by a protective layer and a metal contact material is deposited by evaporation in a direction perpendicular to the notched surface of the support, after which the covering is cleaned from the lands. Following the cleaning, the notched surface of the support is vapor-coated with a first semi-conductor material in a direction such that the righthand edges of the lands act as vapor-deposition masks and the semi-conductor material is deposited on the lands as well as partly on the contact material which has been applied on the righthand surfaces of the notches. Finally, the notched surface of the support is vapor-coated with a second semi-conductor material which is oppositely conducting relative to the first layer and in a direction such that now the lefthand edges of the lands act as vapor-deposition masks and the second semi-conductor material is deposited on the layer of the first semi-conductor material already applied on the lands and, at the same time, on a strip of contact material which has been applied on the lefthand surface of each notch.

A particular advantage of this method is that the semi-conductor bodies can be deposited on the support by evaporation without the necessity of using masks, because the bottom edges, or the edges adjacent the notch surface, of the contact strips carried by the support at the lefthand and righthand sides of the notches act simultaneously as masks.

It is only prior to the deposition of the semi-conductor material that the lands, serving to support the semi-conductor bodies, must be covered up. This is possible, for example, by initially coating the entire undersurface of the support with a varnish layer and then cutting the notches into the underside or undersurface. It is also possible, of course, initially to mill the notches in the support and then to provide the lands with a varnish coating, preferably by printing.

In a semi-conductor battery manufactured in this manner, each of the oppositely conducting layers of each semi-conductor body is connected to the contact strips applied in the notches, along the respective edge of the contact strip. Due to this electrical series connection of the individual semi-conductor bodies, if a load is applied to the battery, a voltage determined by the number of semi-conductor bodies, and a current, determined by the length of the individual semi-conductor bodies, is available. Since, with the practicable dimensions, only a current of low intensity can be obtained, narrow contact strips and electrical contact surfaces between the contact strips and the semi-conductor bodies may be provided without running the risk of an extensive heating of the semi-conductor battery. However, it is possible, for improving the heat dissipation and the contact, to enlarge the contact zones by providing the outer layer, remote from the support, of each semi-conductor body with a layer of contact material which is electrically connected to that one of the contact strips which is already electrically connected to the outer layer now being coated with the contact material. This is done in a particularly simple manner by vapor-depositing the outer layer of contact material on the underside or undersurface of the semi-conductor battery in a direction forming a smaller angle with the underside of the support than the direction in which the outer layer, remote from the support, of each semi-conductor body has been deposited by evaporation. Furthermore, considering the longitudinal direction of the lands, the outer layer of contact material is deposited by evaporation on an area larger than the outer semi-conductor layer, remote from the support, and this outer layer is deposited on an area larger than the inner semi-conductor layer, adjacent the support.

An object of the invention is to provide an improved semi-conductor battery of the type including a plurality of laminar semi-conductor bodies arranged on a dielectric support in parallel relation to each other and electrically interconnected by contact strips.

A further object of the invention is to provide such a semi-conductor battery resulting in an improvement of the mechanical and electrical properties of the semi-conductor battery as compared to the prior art and in a protection of the semi-conductor bodies against atmospheric influences and radiation.

For an understanding of the principles of the invention, reference is made to the following description of a typical embodiment thereof as illustrated in the accompanying drawings.

DESCRIPTION OF THE PREFERRED EMBODIMENT

Figure 1:
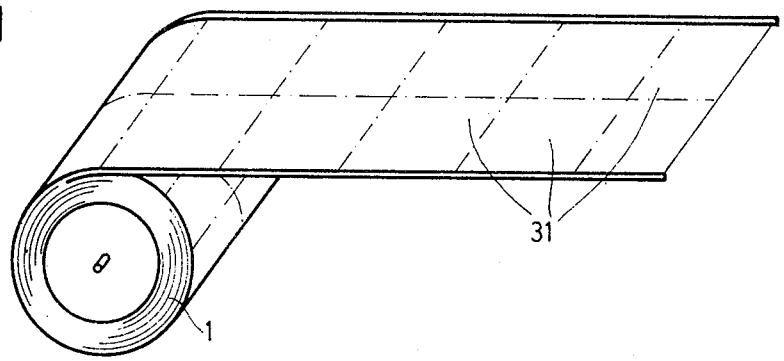
FIG. 1 is a perspective view of the support of a semi-conductor battery, embodying the invention, wound into a roll.
Figure 2:
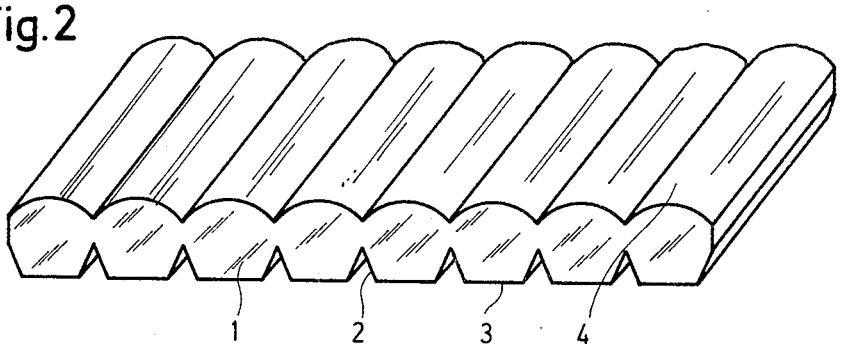
FIG. 2 is a perspective view illustrating the structure of the support.

A foil of transparent material, capable of being rolled up, is used as a support 1 of a semi-conductor battery, as shown in FIG. 1. Transversely to the winding direction, the foil has a structure as shown in FIG. 2. The underside of the foil is provided with equidistantly spaced triangular notches 2 extending across the entire width of the foil. Lands 3 are left between the notches. The upper side of the foil is formed with parallel juxtaposed cylindrical segments 4, thus given a pattern of a reeding where each reed 4 is associated with a respective land 3. The diameter of the cylindrical reeding surfaces 4 is chosen so that the radii pass throught the associated land 3, i.e., the perpendicularly incident light is directed to the associated land 3. On the lands 3 of support 1 having this shape, semi-conductor bodies are deposited by evaporation in a manner shown in FIGS. 3a to 3f.

Figure 3A:
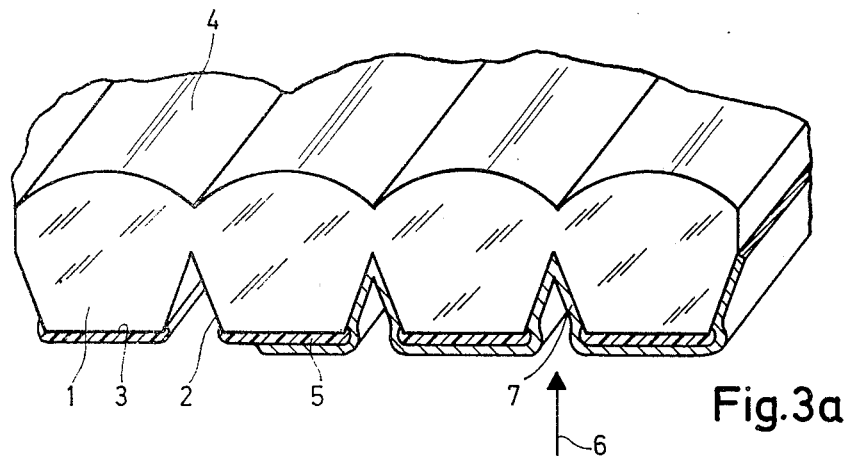
FIGS. 3a – 3f are partial perspective views, partly in section, of a semi-conductor battery embodying the invention and showing consecutive phases of the manufacturing operation.
Figure 3B:
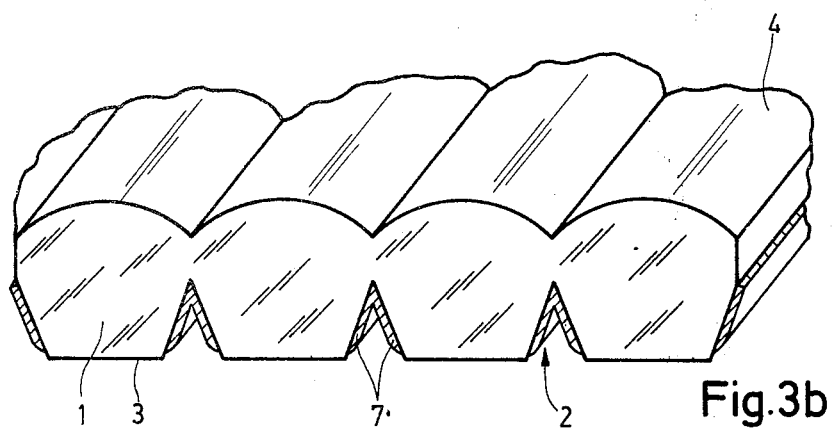

First, only the lands 3 of support 1 are coated with a layer of varnish 5, preferably in a printing operation. Thereupon, a contact material, for example, silver or silver titanate, is applied to the support by vapor deposition perpendicularly to the notched underside or surface of support 1, in the direction of arrow 6, as shown in FIG. 3a. Then varnish layer 5 is removed from lands 3 and lands 3 are cleaned, so that the contact material previously deposited by evaporation remains only in notches 2 in the form of contact strips 7, as shown in FIG. 3b. By an appropriate application of varnish layer 5, care has been taken to have the contact strips slightly spaced from the underside of the support, thus not extending down to the very outer edges of the notches 2.

Figure 3C:
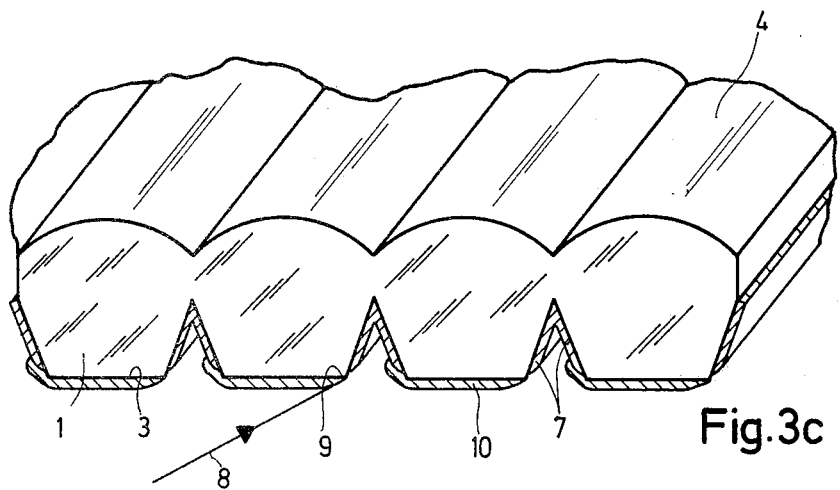

On the underside of support 1 thus prepared, an electron conducting semi-conductor material, for example, n-silicon, is deposited by evaporation in the direction or arrow 8, as shown in FIG. 3c. The direction of vapor deposition 8 is chosen that each of the righthand edges 9 of the lands, as shown in FIG. 3c, acts as a mask preventing deposition within any substantial part of the adjacent notch 2 and the semi-conductor material is deposited fully only on lands 3 while, on the opposite righthand side of the adjacent notch 2, the contact strip 7 already applied is coated with the semi-conductor material in a narrow area along the edge. At the lefthand side of notch 2, no contact is established between the newly applied semi-conductor layer 10 and the respective contact strip 7.

Figure 3D:
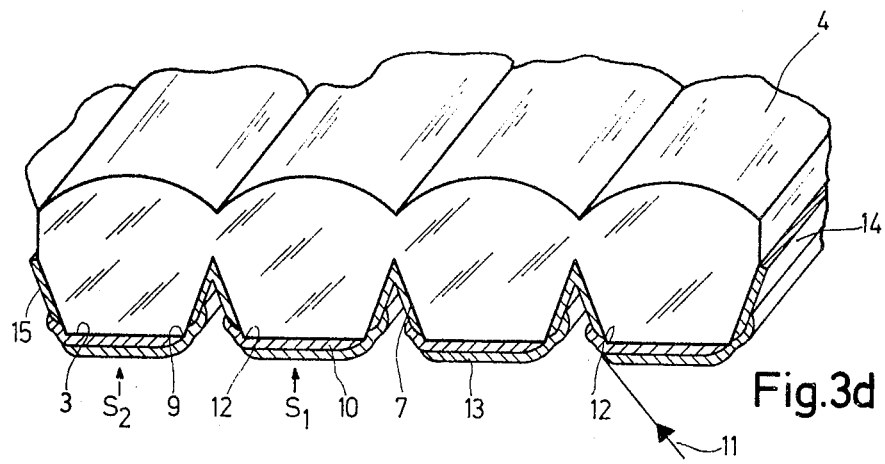

In a next step, illustrated in FIG. 3d, a hole-conducting semi-conductor material, for example, p-silicon, is deposited by evaporation on the underside of support 1, in the direction of arrow 11. The direction 11 is so chosen that, analogously, now the lefthand land edges 12, already coated with layer 10, act as masks for the vapor deposition. Thus, a layer 13 of p-conducting semi-conductor material is deposited on layer 10 and the opposite contact strips 7 are coated in a narrow area along the lefthand edges of notches 2. Because of the direction of vapor deposition, no contact is established between the contact strips at the righthand side of the notches and newly deposited layer 13.

Following this manufacturing step, the semi-conductor battery is ready for operation since, due to the described manner of vapor deposition, the individual semi-conductor bodies S, each comprising two layers, 10 and 13, are series-connected, i.e., each electron-conducting layer 10 of each semi-conductor body $S_1$ is connected, through a contact strip 7, to the hole conducting layer 13 of the respective adjacent semi-conductor body $S_2$. In consequence, with incident light, a voltage can be derived between points 14 and 15 indicated in FIG. 3d.

Figure 3E:
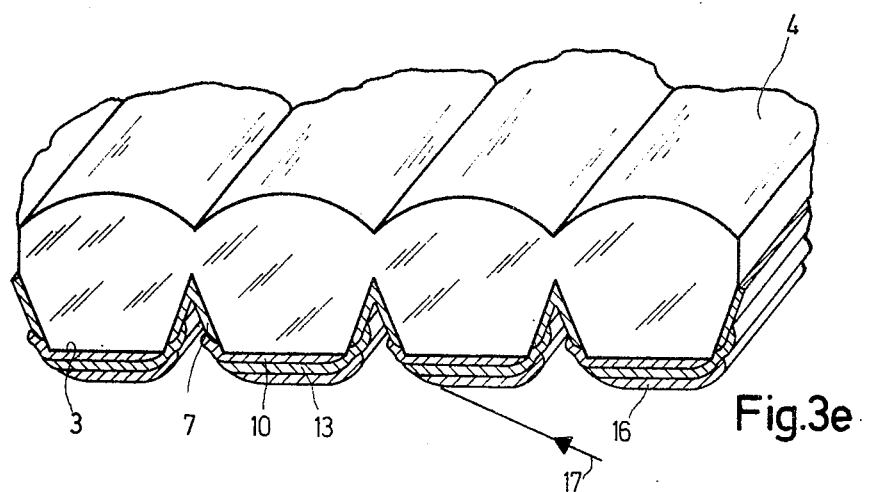

To prevent excessive heating of the semi-conductor battery during operation with higher current intensities, and to obtain an effective electrical contacting, it is advisable to apply a further layer 16 of contact material upon hole-conducting layer 13, by vapor deposition in the direction of arrow 17, as shown in FIG. 3e. This direction is so chosen as to coat layer 13 completely, even partly in the area of the lefthand contact strip 7, as far as possible with regard to the direction of deposition. However, care is to be taken that layer 16 does not come into contact with layer 10 which is deposited below layer 13 because, in such a case, the battery would be short-circuited. That is also why direction 17 has to form a smaller angle with the underside of support 1 than does direction 11.

Figure 4:
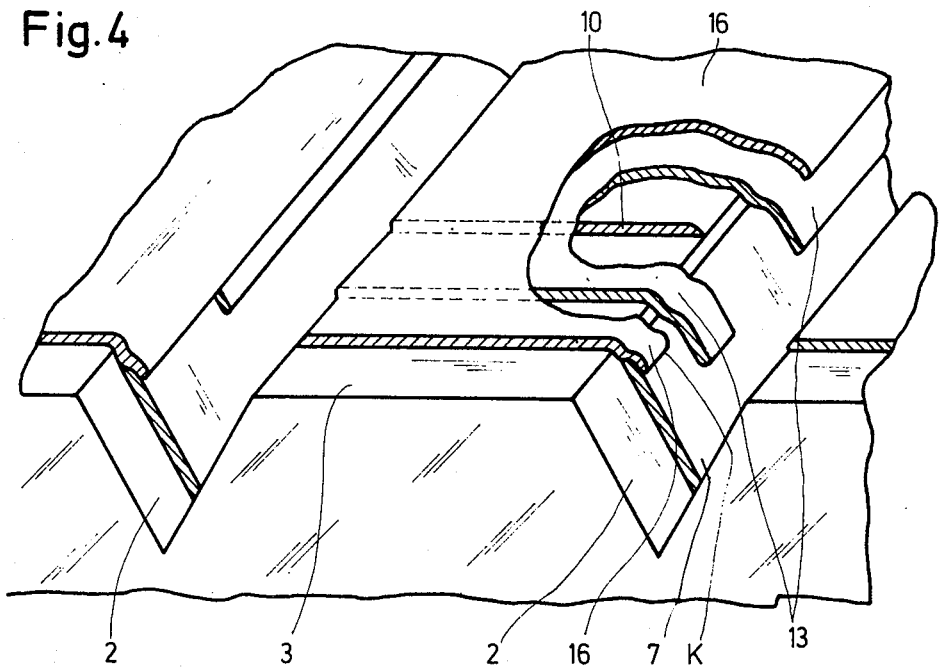
FIG. 4 is an enlarged partial perspective view, partly in section, of the underside of a semi-conductor battery embodying the invention and illustrating the electrical contacts between the individual semi-conductor bodies.
Figure 4:
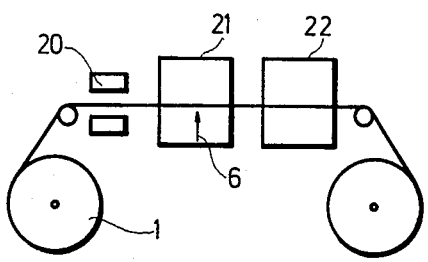

While applying layer 16 in the direction 17 without any further provision, no contact would be obtained at the lefthand side of notches 2 between layers 16 and the respective contact strip 7 within the area of extension of p-layer 13. To obtain such an electrical contact, the individual layers of the semi-conductor bodies and of the contact material are deposited over mutually different areas, as shown in FIG. 4. Layer 10 of electron-conducting semi-conductor material is deposited, considered in the direction of longitudinal extension of lands 3, over the smallest area and is overlapped by layer 13 of hole-conducting semi-conductor material. Contact strips 7, as well as layers 16 of contact material, are deposited on the underside of support 1 over a still larger area than are layers 13 so that, at the lefthand sides of notches 2, all layers 16 are electrically connected with the respective contact strips 7 in the zone K (FIG. 4). Thus, the free charges released at the p-n-junctions of the semi-conductor bodies are collected in layers 16 and conducted, in zone K, through contact strips 7 to the respective adjacent semi-conductor body.

Figure 3F:
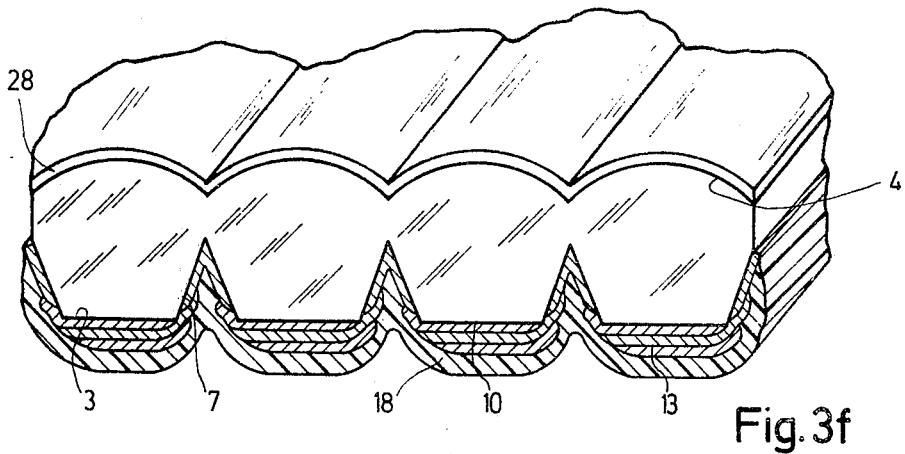

To protect the semi-conductor bodies, the entire underside of the finished semi-conductor battery is coated with an electrically insulating protective layer 18, for example, of plastic, as shown in FIG. 3f. Preferably, the plastic is applied by spraying.

Figure 5:
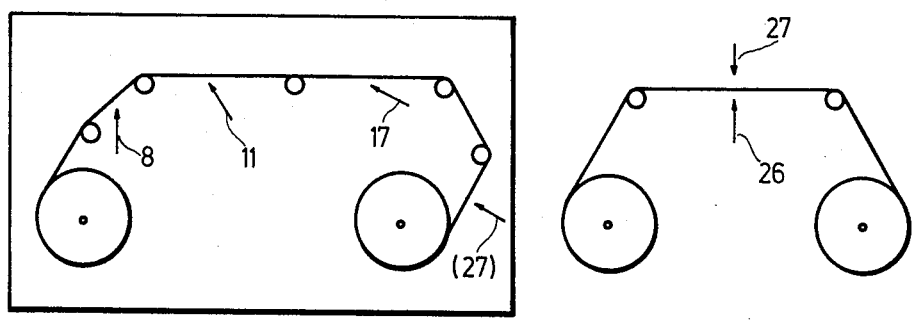
FIG. 5 is a diagrammatic illustration of means for manufacturing a semi-conductor battery embodying the invention.

Since in the process of manufacture provided by the invention, no special masking technology is needed, simplifies manufacturing of semi-conductor batteries is made possible, as shown in FIG. 5. Support material 1 is first fed into a printing station 20 where lands 3 are provided with a layer of varnish 10. Thereupon, support 1 is guided through a first evaporation chamber 21 in which the contact strips 7 are deposited by evaporation on the notch surfaces on the underside of the support, in the direction 6. After being passed through a washing bath 22 where the varnish layer 5 is removed, the support is wound up and inserted into a second evaporation chamber 23 in which the semi-conductor layers 10 and 13 as well as the contact layer 16 are deposited by evaporation on the underside of the support, consecutively in the respective directions 8, 11 and 17 and in mutually unequal widths, according to FIG. 4. In a further operation, at a location 26, finally the underside of the support is provided with a protection layer 18 of plastic and, at 27, the upper side of support 1 is provided with an anti-reflection coating 28, as shown in FIG. 3f, to improve the light yield. The anti-reflection coating, of course, may also be applied in one of the evaporation chambers 21 or 23. Thereupon, support 1 is again wound up on a roll or, as indicated in FIG. 1 in dotted lines, cut into smaller support plates 31.

Figure 6:
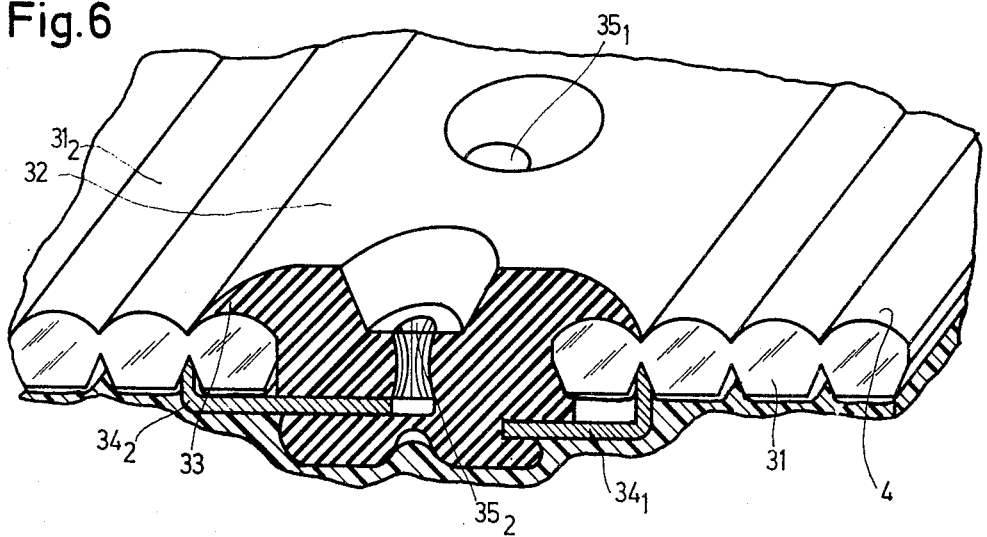
FIG. 6 is a partial perspective view, partly in section, illustrating an electrical and mechanical interconnection of two semi-conductor batteries embodying the invention.

As shown in FIG. 6, such support plate may be connected to each other by means of connection pieces 32 formed with rubber lips 33 which engage over each of the support plates, to be connected, along a reed 4, while, on each side of the connection piece, a resilient contact strip $34_1$, $34_2$ engages into a notch 2 of support plates $31_1$, and $31_2$, respectively, where it is brought into contact with the respective contact strip 7. Contact strips $34_1$, $34_2$ are connected to a plurality of connector sockets $35_1$, $35_2$. In the example shown, contact strip $34_2$ is connected to connector socket $35_2$ while contact strip $34_1$ is supposed to be connected to connector socket $35_1$. It is thus possible, by a corresponding connection of sockets 35, to connect support plates $31_1$ and $31_2$ in series or in parallel.

As already mentioned, any dimensions may be chosen in the design of the described semi-conductor battery. It need only be taken into account that the voltage per surface unit decreases with the width of lands 3 on the underside of support 1. As far as the mentioned flexible foil is used for supporting the battery, it has been found advantageous to have the width of the lands in the order of millimeters.

It should be further noted that, aside from the described photosensitive semi-conductor bodies, semi-conductor thermoelements responsive to temperature differences may also be deposited on such a support by evaporation. To operate such a semi-conductor battery, the back side of the battery is cooled in the zone of protective layer 18. With the cooling liquid used, a heat accumulator may be operated so that the yield of the described device can be increased. It is further possible to apply heat sensitive semi-conductor bodies by vapor deposition on the support in addition to the mentioned photo-sensitive semi-conductor bodies.

While a specific embodiment of the invention has been shown and described in detail to illustrate the application of the principles of the invention, it will be understood that the invention may be embodied otherwise without departing from such principles.

What is claimed is:

1. In a semi-conductor battery of the type including a plurality of laminar semi-conductor bodies arranged on a dielectric support in parallel relation to each other and each comprising two layers of respectively oppositely conducting semi-conductor materials forming a photovoltaic junction, with the layer adjacent the support being of the same conducting type in all the semi-conductor bodies, and contact strips electrically interconnecting oppositely conducting layers of adjacent semi-conductor bodies and extending throughout the length of the adjacent semi-conductor bodies, the improvement comprising, in combination, said support having one surface formed with a plurality of notches extending parallel to each other and separated by lands, said semi-conductor bodies being applied directly to said lands; said contact strips extending in said notches between two adjacent lands and being, along the edge of one land of the two adjacent lands, in electrical contact with that layer, of the respective semi-conductor body on said one land, which is directly adjacent said support and, along the edge of the other land of the respective two adjacent lands, in electrical contact with that layer, of the respective semi-conductor body on said other land, which is remote from said support.

2. In a semi-conductor battery, the improvement claimed in claim 1, in which said support is flexible.

3. In a semi-conductor battery, the improvement claimed in claim 1, in which said battery is used as a solar battery and said support is transparent.

4. In a semi-conductor battery, the improvement claimed in claim 3, in which the notch walls coated with the contact strips are so formed as to reflect at least a part of the light incident thereon onto the semi-conductor bodies.

5. In a semi-conductor battery, the improvement claimed in claim 1, in which said notches have a triangular cross-section.

6. In a semi-conductor battery, the improvement claimed in claim 1, in which the opposite surface of said support is divided into individual, juxtaposed cylindrical segments extending parallel to each other and parallel to said lands; each land being associated with a single respective cylindrical segment and the associated single respective cylindrical segment having a radius of curvature such that light incident thereon at a right angle thereto is directed onto the semi-conductor body on the associated land.

7. In a semi-conductor battery, the improvement claimed in claim 1, in which the outer layer, remote from said support, of each semi-conductor body is provided with a layer of contact material which is electrically connected to that contact strip electrically connected to said outer layer of semi-conductor material.

8. In a semi-conductor battery, the improvement claimed in claim 1, which said one surface of said support having said semi-conductor bodies and said contact strips thereon is covered with a protective layer of electrically insulating material.

9. In a semi-conductor battery, the improvement claimed in claim 8, in which said protective layer is elastic.

10. In a semi-conductor battery, the improvement claimed in claim 1, including means operable to electrically interconnect two said semi-conductor batteries; said means comprising a connection piece formed with rubber lips engageable over facing edges of the respective supports of the two semi-conductor batteries; each connection piece having, at each side, a resilient contact strip engageable into a notch of the associated respective support to contact the contact strip in the notch; and respective connector sockets electrically connected to each contact strip of said connection piece; whereby, by corresponding connection of said sockets to each other, said two semi-conductor batteries may be connected in series or in parallel.

* * * * *